(12) United States Patent
Scholz (10) Patent No.: US 10,233,365 B2
(45) Date of Patent: Mar. 19, 2019

(54) BOND PLY MATERIALS AND CIRCUIT ASSEMBLIES FORMED THEREFROM

(71) Applicant: ROGERS CORPORATION, Rogers, CT (US)

(72) Inventor: William F. Scholz, Scottsdale, AZ (US)

(73) Assignee: ROGERS CORPORATION, Rogers, CT (US)

(*) Notice: Subject to any disclaimer, the term of this patent is extended or adjusted under 35 U.S.C. 154(b) by 128 days.

(21) Appl. No.: 14/951,814

(22) Filed: Nov. 25, 2015

(65) Prior Publication Data

US 2017/0145266 A1 May 25, 2017

(51) Int. Cl.
| | | |
|---|---|---|
| *C09J 147/00* | (2006.01) | |
| *C09J 153/02* | (2006.01) | |
| *H05K 1/03* | (2006.01) | |
| *C09J 7/00* | (2018.01) | |
| *H05K 1/14* | (2006.01) | |
| *H05K 3/46* | (2006.01) | |
| *C09J 7/10* | (2018.01) | |
| *C09K 21/12* | (2006.01) | |

(52) U.S. Cl.
CPC ............... *C09J 147/00* (2013.01); *C09J 7/00* (2013.01); *C09J 7/10* (2018.01); *C09J 153/02* (2013.01); *H05K 1/03* (2013.01); *H05K 1/144* (2013.01); *H05K 3/4635* (2013.01); *C08J 2421/00* (2013.01); *C08J 2447/00* (2013.01); *C08J 2471/00* (2013.01); *C09J 2203/326* (2013.01); *C09J 2205/102* (2013.01); *C09J 2409/00* (2013.01); *C09J 2421/00* (2013.01); *C09J 2423/00* (2013.01); *C09J 2471/00* (2013.01); *H05K 3/4623* (2013.01)

(58) Field of Classification Search
CPC ...... H05K 1/03; H05K 1/144; C09J 2203/326
USPC ......................................................... 428/521
See application file for complete search history.

(56) References Cited

U.S. PATENT DOCUMENTS

| | | |
|---|---|---|
| 6,291,627 B1 | 9/2001 | Wang et al. |
| 6,524,709 B1 | 2/2003 | Sagara et al. |
| 7,022,404 B2 | 4/2006 | Sethumadhavan et al. |
| 7,790,268 B2 | 9/2010 | Kennedy |
| 8,431,222 B2 | 4/2013 | Paul |

(Continued)

FOREIGN PATENT DOCUMENTS

| | | |
|---|---|---|
| CN | 102100130 A | 6/2011 |
| EP | 2291061 A2 | 3/2011 |

(Continued)

OTHER PUBLICATIONS

International Search Report of the International Searching Authority for International Application No. PCT/US2016/063026; Date of Completed : Mar. 2, 2017; dated Mar. 16, 2017; 6 Pages.

(Continued)

*Primary Examiner* — Fred M Teskin
(74) *Attorney, Agent, or Firm* — Cantor Colburn LLP (57) ABSTRACT

A composition for a bond ply, and a circuit subassembly that comprises such bond ply, are disclosed. The circuit subassembly can have a UL-94 rating of V-0. The composition of the bond ply layer comprises 25 to 45 volume percent of liquid resin; 10 to 40 weight percent of a bromine-containing or phosphorus-containing aromatic compound having a peak melting point of at least about 260° C.; and 5 to 35 volume percent inorganic filler.

20 Claims, 2 Drawing Sheets

(56) References Cited

U.S. PATENT DOCUMENTS

| | | |
|---|---|---|
| 2003/0141014 A1 | 7/2003 | Satoyuki et al. |
| 2005/0038278 A1 | 2/2005 | Dittrich et al. |
| 2005/0038279 A1 | 2/2005 | Dittrich et al. |
| 2005/0202261 A1 | 9/2005 | Takai et al. |
| 2008/0259234 A1 | 10/2008 | Lin et al. |
| 2010/0234495 A1 | 9/2010 | Roth |
| 2010/0307803 A1 | 12/2010 | Sankar |
| 2011/0054079 A1 | 3/2011 | Gan |
| 2011/0060096 A1 | 3/2011 | Kaneko et al. |
| 2011/0214906 A1* | 9/2011 | Baars .............. B05D 5/12 174/257 |
| 2011/0294920 A1 | 12/2011 | Fuchs et al. |
| 2012/0006588 A1 | 1/2012 | Kakiuchi et al. |
| 2012/0322923 A1 | 12/2012 | Wermter et al. |
| 2013/0018128 A1* | 1/2013 | Yao .............. C07F 9/6571 523/451 |
| 2013/0266779 A1 | 10/2013 | Tokiwa et al. |
| 2014/0004324 A1 | 1/2014 | Hsieh et al. |
| 2014/0011962 A1 | 1/2014 | He et al. |
| 2014/0113118 A1 | 4/2014 | Wang et al. |
| 2014/0148556 A1 | 5/2014 | Meng et al. |
| 2014/0154939 A1 | 6/2014 | Rong et al. |
| 2014/0349090 A1 | 11/2014 | Hsieh |
| 2015/0030824 A1 | 1/2015 | Crosley |
| 2015/0148450 A1 | 5/2015 | Tang et al. |
| 2015/0183976 A1 | 7/2015 | Banda et al. |
| 2015/0296614 A1 | 10/2015 | Williams et al. |
| 2015/0351237 A1 | 12/2015 | Scholz et al. |
| 2016/0021739 A1 | 1/2016 | Li et al. |
| 2016/0021740 A1 | 1/2016 | Li et al. |
| 2016/0060281 A1 | 3/2016 | Angell et al. |
| 2016/0129666 A1 | 5/2016 | Hsieh et al. |
| 2016/0222204 A1 | 8/2016 | Wang et al. |

FOREIGN PATENT DOCUMENTS

| | | |
|---|---|---|
| WO | 2003036968 A1 | 5/2003 |
| WO | 2010135393 A1 | 11/2010 |
| WO | 2010135398 A1 | 11/2010 |
| WO | 2011123389 A1 | 10/2011 |

OTHER PUBLICATIONS

Written Opinion of the International Searching Authority for International Application No. PCT/US2016/063026; International Filing Date: Nov. 21, 2016; 7 Pages.

* cited by examiner

BOND PLY MATERIALS AND CIRCUIT ASSEMBLIES FORMED THEREFROM

BACKGROUND

This invention generally relates to materials used in making multilayer circuits.

As used herein, a circuit subassembly is an article used in the manufacture of circuits and multilayer circuits, and includes circuit laminates, packaging substrate laminates, build-up materials, bond plies, resin coated conductive layers, and cover films. A circuit laminate is a type of circuit subassembly that has a conductive layer, e.g., copper, fixedly attached to a dielectric substrate layer. Double clad laminates have two conductive layers, one on each side of the dielectric layer. Patterning a conductive layer of a laminate, for example by etching, provides a circuit. Multilayer circuits comprise a plurality of conductive layers, at least one of which contains a conductive wiring pattern.

Typically, multilayer circuits are formed by laminating, using heat and/or pressure, two or more materials, at least one of which contains a circuit layer, using bond plies. For example, a bondply can be in contact with a circuit layer of each of two double-clad dielectric substrates, when laminated in proper alignment.

In use, a bondply, or a portion thereof, can flow and completely fill the space and provide adhesion between circuits, between a circuit and a conductive layer, between two conductive layers, or between a circuit and a dielectric layer. The one or more of the polymers in a bondply are designed to soften or flow during manufacture of the multilayer circuit but not in use of the circuit. In multilayer structures, after lamination, known hole-forming and plating technologies may be used to produce useful electrical pathways between conductive layers.

The optimum structural design of a bondply in a laminate would involve a composition that is homogeneous throughout and that provides the same electrical, thermal, and mechanical properties (including low dielectric constant and low dissipation factor) as that of the copper clad laminate. A bondply used in the formation of rigid circuit laminates, multilayer circuits, and subassemblies, can optionally comprise a glass fabric saturated with an uncured or B-staged polymer composition, which cures in the circuit or subassembly lamination process. The glass fabric can provide a hard stop to prevent conductors on opposing layers from coming too close to each other and causing low resistance or other problems.

Bond plies and other circuit subassembly materials can contain synthetic organic materials having high carbon and hydrogen contents, which are potentially combustible. Many applications, however, demand that they meet strict flame retardancy requirements such as those mandated in the building, electrical, transportation, mining and automotive industries. To meet such demands, such materials can include additives intended to interfere in various ways with a chemical exothermic chain of combustion.

In particular, compositions for circuit materials can use halogenated, specifically brominated, flame retardant additives to achieve necessary levels of flame retardancy. Alternatively, 'halogen-free' circuit materials that have a UL94 flame retardance rating of V-1 or better, especially without bromine or chlorine, can be used, wherein the specification for 'halogen-free' in a circuit material is less than 900 parts per million (ppm) of bromine, chlorine, or a combination thereof.

Among halogen-free flame retardants are organo-phosphorous flame retardants with reactive groups (active hydrogens), such as those derived from 9,10-dihydro-9-oxa-10-phosphaphenantrene-10-oxide ("DOPO"), which flame retardants have been used in epoxy resin formulations and laminates, for example, as disclosed in US 2010/0234495. More recently, DOPO-derived flame retardants that do not have active hydrogen groups have been disclosed for use in various formulations, for example, as disclosed in WO 2011/123389 A1 and WO 2010/135398 A1.

Flame retardants in a bondply, however, can impair the desired physical properties or electrical properties of a bondply or other circuit material. It is desirable, therefore, to obtain an improved bondply that has both the desired flame retardance and the desired flow characteristics during lamination of a circuit laminate. In particular, there is a need for a new class of bondply materials having improved fill and flow properties, while having a non-tacky surface before lamination, compared to standard bondply offerings in the industry today.

SUMMARY OF INVENTION

One aspect of the invention is directed to a bondply layer, having a thickness of 50 to 400 micrometers, formed from a composition that, absent solvent (i.e., component percents on a dry basis), comprises:

25 to 45 volume percent of liquid resin comprising polybutadiene and/or polyisoprene and, in addition, a nitrogen-containing compound having allyl groups, wherein the nitrogen-containing compound is present in an amount of 5 to 15 volume percent, based on total composition and polybutadiene and/or polyisoprene in an amount of 20 to less than 60 volume percent, based on the total resin;

10 to 40 weight percent of a bromine-containing or phosphorus-containing aromatic compound having a peak melting point of at least about 260° C.; and 5 to 35 volume percent inorganic filler;

wherein the bondply has a UL-94 rating of at least V-1, a $D_f$ of less than 0.006 at 10 GHz and a $D_k$ of 2 to 10 at 10 GHz.

Another aspect of the invention is directed to a bondply layer, having a thickness of 50 to 400 micrometers, formed from a thermosetting composition that, based on percents absent solvent, comprises:

5 to 20 weight percent of poly(arylene ether) and 5 to 20 weight percent of an elastomer, based on the weight of the composition;

20 to 30 volume percent of inorganic filler; and 25 volume percent to less than 37 volume percent of liquid resin, which liquid resin comprises:

20 to 40 volume percent polybutadiene or polyisoprene, based on total resin; and 5 to 10 volume percent of a nitrogen-containing compound that contains allyl groups, wherein the amount is based on the total composition;

wherein the circuit subassembly has a UL-94 rating of at least V-1, a $D_f$ of less than 0.006 at 10 GHz and a $D_k$ of 2 to 10 at 10 GHz.

Yet another aspect of the invention is directed to a circuit subassembly comprising:

at least two circuit laminates, each comprising:

a dielectric substrate layer formed from a thermosetting composition;

a conductive metal layer bonded to each side of the dielectric substrate layer, wherein at least one of the conductive metal layers of each circuit laminate has been patterned to form a circuit;

a bondply layer disposed between the circuits of on each of the two circuit laminates wherein each of the two sides of the bondply is in direct contact with a circuit of one of the two circuit laminates, which bondply layer is the product of a process of lamination in which the bondply flows and fills areas of the dielectric substrate layer that are not covered by circuit formed by patterned conductive metal layer, wherein the bondply layer is formed from a composition that, based on percents absent solvent, comprises:

25 to 45 volume percent of liquid resin comprising polybutadiene and/or polyisoprene and, in addition, a nitrogen-containing compound having allyl groups, wherein the nitrogen-containing compound is present in an amount of 5 to 15 volume percent, based on total composition and polybutadiene and/or polyisoprene in an amount of 20 to less than 60 volume percent, based on the total resin;

10 to 40 weight percent of a bromine-containing or phosphorus-containing aromatic compound having a peak melting point of at least about 260° C.; and 5 to 35 volume percent inorganic filler;

wherein the circuit assembly has a UL-94 rating of at least V-0, a $D_f$ of less than 0.006 at 10 GHz and a $D_k$ of less than 2 to 10 at 10 GHz.

Still other aspects of the invention are directed to a printed wiring board formed from the above-described circuit subassemblies and to a method for the manufacture of the circuit subassemblies. The invention is further illustrated by the following drawings, detailed description, and examples.

BRIEF DESCRIPTION OF DRAWINGS

Referring now to the schematic representations of exemplary circuit subassemblies.

DETAILED DESCRIPTION

The composition of the bondply layer can independently comprise a polybutadiene or polyisoprene polymer, including modified or vinyl terminated polybutadiene or polyisoprene polymers as described below. The term "polybutadiene or polyisoprene polymer," as used herein, includes homopolymers derived from butadiene, homopolymers derived from isoprene, and copolymers derived from butadiene and/or isoprene and/or less than 50 wt. % of a monomer co-curable with the butadiene and/or isoprene. In other words, a copolymer of butadiene and/or isoprene can comprise polymers with greater than 50 wt. % butadiene, greater than 50% isoprene, or greater than 50% of butadiene plus isoprene. Suitable monomers co-curable with butadiene and/or isoprene include monoethylenically unsaturated compounds such as acrylonitrile, ethacrylonitrile, methacrylonitrile, alpha-chloroacrylonitrile, beta-chloroacrylonitrile, alpha-bromoacrylonitrile, $C_{1-6}$ alkyl (meth)acrylates (for example, methyl (meth)acrylate, ethyl (meth)acrylate, n-butyl (meth)acrylate, n-propyl (meth)acrylate, and isopropyl (meth)acrylate), acrylamide, methacrylamide, maleimide, N-methyl maleimide, N-ethyl maleimide, itaconic acid, (meth)acrylic acid, styrene, alkenyl aromatic compounds as described below, and a combination comprising at least one of the foregoing monoethylenically unsaturated monomers.

In an advantageous embodiment, the polybutadiene polymer comprises a syndiotactic polybutadiene homopolymer with no co-curable monomer. The syndiotactic polybutadiene homopolymer is often used in combination with a different polybutadiene polymer, a polyisoprene polymer, or a combination thereof.

Exemplary thermosetting polybutadiene and/or polyisoprene resins include, but are not limited to, butadiene homopolymers, isoprene homopolymers, butadiene-vinylaromatic copolymers such as butadiene-styrene, isoprene-vinylaromatic copolymers such as isoprene-styrene copolymers, and the like.

The thermosetting polybutadiene and/or polyisoprene resins include modified resins. For example, the resins can be hydroxyl-terminated, methacrylate-terminated, and/or carboxylate-terminated resins. Post-reacted resins can be used, such as epoxy-, maleic anhydride-, or urethane-modified butadiene or isoprene resins. The resins can also be cross-linked, for example by divinylaromatic compounds such as divinyl benzene, e.g., a polybutadiene-styrene crosslinked with divinyl benzene. Suitable resins are broadly classified as "polybutadienes" by their manufacturers, for example Nippon Soda Co., Tokyo, Japan, and Total Hydrocarbon Specialty Chemicals, Exton, Pa. Mixtures of resins can be used, for example, a mixture of a polybutadiene homopolymer and a poly(butadiene-isoprene) copolymer. Combinations comprising a syndiotactic polybutadiene can also be used.

The thermosetting polybutadiene and/or polyisoprene resin in the bondply can be liquid at room temperature. Suitable liquid resins can have a number average molecular weight greater than about 5,000, but generally have a number average molecular weight of less than about 5,000 (specifically about 1,000 to about 3,000). In some embodiments, thermosetting polybutadiene and/or polyisoprene resins have at least 90 wt. % 1,2 additions in order that they exhibit greater crosslink density upon cure due to the large number of pendent vinyl groups available for crosslinking.

In some embodiments, the thermosetting polybutadiene and/or polyisoprene resin in the bondply is present in an amount of 5 to 20 percent by weight of the bondply composition, specifically 8 to 15 percent by weight of the composition. The thermosetting polybutadiene and/or polyisoprene resin can form part of the liquid resin (when formulated), in an amount of 5 to less than 60 volume percent, specifically 10 to 55 volume percent, more specifically 20 to 45 volume percent, most specifically 30 to less than 40 volume percent, based on the total resin in the composition.

The composition of the bondply for a circuit subassembly can independently further comprise a poly(arylene ether), which can be in the form of a homopolymer or a copolymer, including a graft or block copolymer. Combinations of various forms can be used. Poly(arylene ether)s comprise a plurality of structural units of structure:

(15)

wherein for each structural unit, each R and R' is independently hydrogen, primary or secondary $C_{1-7}$ alkyl, phenyl, $C_{1-7}$ aminoalkyl, $C_{1-7}$ alkenylalkyl, $C_{1-7}$ alkynylalkyl, $C_{1-7}$ alkoxy, $C_{6-10}$ aryl, and $C_{6-10}$ aryloxy. In some embodiments, each R is independently $C_{1-7}$ alkyl or phenyl, for example, $C_{1-4}$ alkyl, and each R' is independently hydrogen or methyl.

Exemplary poly(arylene ether)s include poly(2,6-dimethyl-1,4-phenylene ether), poly(2,6-diethyl-1,4-phenylene ether), poly(2,6-dipropyl-1,4-phenylene ether), poly(2-methyl-6-allyl-1,4-phenylene ether), poly(di-tert-butyl-dimethoxy-1,4-phenylene ether), poly(2,6-dichloromethyl-1,4-phenylene ether, poly(2,6-dibromomethyl-1,4-phenylene ether), poly(2,6-di(2-chloroethyl)-1,4-phenylene ether), poly(2,6-ditolyl-1,4-phenylene ether), poly(2,6-dichloro-1,4-phenylene ether), poly(2,6-diphenyl-1,4-phenylene ether), and poly(2,5-dimethyl-1,4-phenylene ether). A useful poly(arylene ether) comprises 2,6-dimethyl-1,4-phenylene ether units, optionally in combination with 2,3,6-trimethyl-1,4-phenylene ether units.

The poly(arylene ether), specifically a poly(phenylene ether), can be functionalized so as to provide a functional group that enhances adhesion between a conductive metal layer and a circuit substrate layer. Functionalization can be accomplished using a polyfunctional compound having in the molecule both (i) a carbon-carbon double bond or a carbon-carbon triple bond, and (ii) one or more of a carboxy group, including a carboxylic acid, anhydride, amide, ester, or acid halide. In one embodiment the functional group is a carboxylic acid or ester group. Examples of polyfunctional compounds that can provide a carboxylic acid functional group include maleic acid, maleic anhydride, fumaric acid, and citric acid. A poly(arylene ether) polybutadiene or polyisoprene polymer used in the composition can be co-curable with a polybutadiene or polyisoprene polymer.

In particular, suitable functionalized poly(arylene ether)s include the reaction product of a poly(arylene ether) and a cyclic carboxylic acid anhydride. Examples of suitable cyclic anhydrides are maleic anhydride, succinic anhydride, glutaric anhydride, adipic anhydride, and phthalic anhydride, more specifically, maleic anhydride. Modified poly(arylene ethers) such as maleinated poly(arylene ethers) can be produced by methods as described in U.S. Pat. No. 5,310,820, or are commercially available. Examples of commercially available suitable modified and unmodified poly(arylene ethers) include PPE-MA from Asahi (a maleinized poly(arylene ether)), and Blendex® HPP820 from Chemtura (an unmodified poly(arylene ether), and SA9000 from Sabic Innovative Plastics.

The poly(arylene ether) can have a relatively high number average molecular weight, greater than 5000 Daltons, specifically greater than 10,000 Daltons, as determined by gel permeation chromatography (GPC), typically as specified by the manufacturer. Thus, it is used as a solid, rather than a liquid.

In some embodiments, the thermosetting polybutadiene and/or polyisoprene resin in the bond ply is used in an amount of 5 to 20 percent by weight of the bond ply composition, specifically 10 to 15 percent by weight of the composition. The thermosetting polybutadiene and/or polyisoprene resin can form part or all of the liquid resin (when formulated). However, some amount of solid polybutadiene and/or polyisoprene resin, in can be present. For example, solid polybutadiene and/or polyisoprene resin or solid SBR styrene-butadiene rubber can be used to reduce tackiness as an alternative to poly(arylene ether).

The poly(arylene ether) in the bond ply can be used in an amount of 2 to 20 percent by weight of the bond ply composition, specifically 5 to 10 percent by weight of the composition. The poly(arylene ether) resin can form part of the solid resin (when formulated), in an amount of 3 to 20 volume percent, specifically 5 to 15 volume percent.

In still other embodiments, the bond ply layer can independently comprise an elastomeric polymer, for example, in combination with a poly(arylene ether) and/or polybutadiene. The elastomeric polymer can be co-curable with the poly(arylene ether) and/or the polybutadiene or isoprene resin. A variety of elastomeric polymers can be used, including, for example, block copolymers of butadiene and/or isoprene with a styrenic monomer, vinyl pyridine, acrylonitrile, (meth) acrylic acid and their esters; ethylene-propylene-diene; ethylene-propylene; styrene-(ethylene-butylene)-containing diblock or triblock; silicone or fluorinated elastomers; and the like. The elastomeric polymer can have a glass transition temperature at or below room temperature.

Elastomers include elastomeric block copolymers comprising a block (A) derived from an alkenyl aromatic compound and a block (B) derived from a conjugated diene. The arrangement of blocks (A) and (B) includes linear and graft structures, including radial teleblock structures having branched chains. Examples of linear structures include diblock (A-B), triblock (A-B-A or B-A-B), tetrablock (A-B-A-B), and pentablock (A-B-A-B-A or B-A-B-A-B) structures as well as linear structures containing 6 or more blocks in total of A and B. Specific block copolymers include diblock, triblock, and tetrablock structures, and specifically the A-B diblock and A-B-A triblock structures.

The alkenyl aromatic compound providing the block (A) is represented by structure:

(15)

wherein each of $R^2$ and $R^3$ is independently hydrogen, $C_1$-$C_5$ alkyl, bromo, or chloro, and each of $R^4$, $R^5$, $R^6$, $R^7$, and $R^8$ is independently hydrogen, $C_1$-$C_{12}$ alkyl, $C_3$-$C_{12}$ cycloalkyl, $C_6$-$C_{12}$ aryl, $C_7$-$C_{12}$ aralkyl, $C_7$-$C_{12}$ alkaryl, $C_1$-$C_{12}$ alkoxy, $C_3$-$C_{12}$ cycloalkoxy, $C_6$-$C_{12}$ aryloxy, chloro, bromo, or hydroxy. Exemplary alkenyl aromatic compounds include styrene, 3-methylstyrene, 4-methylstyrene, 3,5-diethylstyrene, 4-n-propylstyrene, alpha-methylstyrene, alpha-methyl vinyltoluene, alpha-chlorostyrene, alpha-bromostyrene, dichlorostyrene, dibromostyrene, tetra-chlorostyrene, and the like, and combinations comprising at least one of the foregoing compounds. Styrene and/or alpha-methylstyrene are often used.

Specific examples of the conjugated dienes used to provide block (B) include 1,3-butadiene, 2-methyl-1,3-butadiene (isoprene), 2,3-dimethyl-1,3-butadiene, and 1,3-pentadiene, specifically 1,3-butadiene and isoprene. A combination of conjugated dienes can be used. The block (B) derived from a conjugated diene is optionally partially or fully hydrogenated.

Exemplary block copolymers comprising a block (A) derived from an alkenyl aromatic compound and block (B) derived from a conjugated diene include styrene-butadiene diblock copolymer (SB), styrene-butadiene-styrene triblock copolymer (SBS), styrene-isoprene diblock copolymer (SI), styrene-isoprene-styrene triblock copolymer (SIS), styrene-(ethylene-butylene)-styrene triblock copolymer (SEBS), styrene-(ethylene-propylene)-styrene triblock copolymer (SEPS), and styrene-(ethylene-butylene) diblock copolymer (SEB). Such polymers are commercially available, for example from Kraton Polymers under the tradenames KRATON D-1101, KRATON D-1102, KRATON D-1107, KRATON D-1111, KRATON D-1116, KRATON D-1117, KRATON D-1118, KRATON D-1119, KRATON D-1122, KRATON D-1135X, KRATON D-1184, KRATON D-1144X, KRATON D-1300X, KRATON D-4141, KRATON D-4158, KRATON G1726, and KRATON G-1652. KRATON D-1118 is a solid SB-SBS copolymer. This copolymer has polystyrene end blocks and a rubbery polybutadiene mid-block with about 20% SBS triblock and about 80% SB diblock. It is a low modulus, low cohesive strength, soft rubber.

The block elastomer in the bond ply can be used in an amount of 1 to 12 percent by weight of the total bond ply composition, specifically 2 to 8 percent by weight of the composition. The block elastomer can form part of the solid resin (when formulated), in an amount of 5 to 20 volume percent, specifically 7 to 15 volume percent.

In some embodiments, the bond ply composition comprises, based on total resin, about 10 to about 70 wt. %, specifically about 15 to about 69 wt. %, more specifically about 20 to about 50 wt. % of the poly(arylene ether), specifically poly(phenylene ether), and about 20 to about 75 wt. %, specifically about 25 to about 60 wt. %, more specifically about 30 to about 50 wt. % of the polybutadiene or polyisoprene polymer(s), each of the foregoing amounts being based on the total weight of the polymer/resin portion of the bond ply composition.

Crosslinking agents for use in the bond ply layer can advantageously comprise multi-functional reactive compounds, which reactive compounds can increase the crosslink density upon cure of the composition of the bond ply.

In particular, it has been found advantageous to use a crosslinking agent in the bond ply layer that is a reactive nitrogen-containing compound. The nitrogen-containing compound can act synergistically with phosphorus-containing compounds in regard to flame retardance. Examples of such nitrogen-containing compounds can include, without limitation, triazines, guanidines, cyanurates, isocyanurates, ammonium polyphosphates, phosphazene, silazane and its polymer, melamine based resins, and the like, and mixtures thereof. Specifically, a reactive cyanurate or isocyanurate compound can include triallyl cyanurate. These nitrogen-containing compounds are known in the art, as are methods for their preparation. Such compounds are also commercially available.

The nitrogen-containing compound in the bond ply layer can be used in an amount of about 5 to about 15 volume percent, specifically 6 to 10 volume percent, more specifically 6.0 to 8.5 volume percent, based on the total weight of the thermosetting composition in order to obtain the desired fill-flow properties in combination with the other components of the composition. In some embodiments, the nitrogen-containing compound in the bond ply layer is used in an amount of about 1 to about 10 percent by weight, specifically 2 to 8 weight percent, more specifically 3 to 6 weight percent, based on the total weight of the thermosetting composition. In contrast, the thermosetting composition of a dielectric layer in a double clad laminate need not have high levels of a nitrogen-containing compound or salt, which can be detrimental to desired properties.

The nitrogen-containing compound in the bond ply is part of the liquid resin (during formulation). During formulation, the nitrogen-containing compound can form part of the liquid resin in an amount of 10 to 30 volume percent, specifically 18 to 29 volume percent, more specifically 21 to 28 volume percent, most specifically 22 to 27 volume percent, based on the total liquid resin.

In some embodiments, the volume percent of liquid resin in the composition of the bond ply (during formulation) is greater than 25 volume percent up to 45 volume percent, in order to obtain good fill and flow during lamination without undue tackiness. Specifically, the liquid resin volume percent can be 25 to 37 volume percent, more specifically 26 to 35 volume percent.

In one embodiment, bond plies comprising phosphorus-containing aromatic fire retardants, for example DOPO derivatives, can use 28 to 31 volume percent liquid resin. In other embodiments, bond plies comprising bromine-containing aromatic fire retardants can use 30 to 35 volume percent liquid resin.

In some embodiments, the liquid resin (or at least 80 volume percent thereof) comprises 50 to 70 volume percent of polybutadiene or polyisoprene polymer; 10 to 30 volume percent of a nitrogen-containing compound containing allyl groups (which can be reactive with the polybutadiene); and optionally 5 to 20 volume percent of a diene reactive monomer, specifically a diene reactive monomer. Diene reactive monomers include, but are not limited to, derivatives of dicyclopentadiene such as ethylene propylene dicyclopentadiene or liquid rubber. In some embodiments, the liquid resin comprises at least 80 volume percent, specifically at least 90 weight percent of polybutadiene or polyisoprene polymer and crosslinking compounds having ally or diene groups.

In some embodiment, the liquid resin includes a diene or other reactive monomer, liquid polybutadiene resin, triallyl cyanurate, and any other resin or resin component that is liquid at room temperature. Spherical silica can also contribute to good fill and flow properties.

The thermosetting composition for the bond ply layer (and also the dielectric substrate material in a circuit subassembly comprising the bond ply layer) further comprises particulate fillers. Examples of suitable fillers include titanium dioxide (rutile and anatase), barium titanate, strontium titanate, silica (particles and hollow spheres) including fused amorphous silica; corundum, cordierite, wollastonite, aramide fibers (e.g., Kevlar®), fiberglass, $Ba_2Ti_9O_{20}$, glass spheres, quartz, boron nitride, aluminum nitride, silicon carbide, beryllia, alumina, magnesia, mica, talcs, nanoclays, aluminosilicates (natural and synthetic), magnesium oxide, and magnesium hydroxide. Combinations of fillers can also be used. More specifically, rutile titanium dioxide and amorphous silica are especially desirable because these fillers have a high and low dielectric constant, respectively, thereby permitting a broad range of dielectric constants combined with a low dissipation factor to be achieved in the final cured product by adjusting the respective amounts of the two fillers in the composition. Most specifically, fused spherical silica particles can be used, in combination with a minor amount of titanium oxide.

The thermosetting composition of the bond ply layer can comprise 5 to 35 volume percent, specifically 20 to 30 volume percent, more specifically 12 to 28 volume percent of inorganic filler. In some embodiments, the volume percent of filler in the bond ply layer, based on total composition (dry, absent solvent) is at least 5 volume percent (specifically at least 7 volume percent, more specifically at least 10 volume percent) less than the volume percent of inorganic filler in the dielectric substrate to which the bond ply is laminated. Thus the amount of filler in the dielectric substrate is typically greater than the amount of filler in the bond ply to which it is laminated.

Similarly, in some embodiments the volume percent of polybutadiene and/or polyisoprene resin in the bond ply layer is at least 5 volume percent (specifically at least 7 volume percent, more specifically at least 10 volume percent) less than the volume percent of of polybutadiene and/or polyisoprene resin, based on total resin, in the dielectric substrate to which the bond ply is laminated. Thus the amount of polybutadiene and/or polyisoprene resin in the dielectric substrate is typically greater than the amount of filler in the bond ply to which it is laminated.

The thermosetting composition for the bond ply layer (and also the dielectric substrate material in a circuit subassembly comprising the bond ply layer) can optionally further include woven, thermally stable webs of a suitable fiber, specifically glass (E, S, D, and NE glass), including flat glass or close-weaved fiber glass, or high temperature organic fibers. Such thermally stable fiber reinforcement provides a circuit laminate with a means of controlling shrinkage upon cure within the plane of the laminate. In addition, the use of the woven web reinforcement, specifically glass fibers, renders a circuit substrate with a relatively high mechanical strength.

In an optional embodiment, the filler in the bond ply layer and/or, in a circuit subassembly, a dielectric layer can be coated, i.e., surface treated. Examples of coated filler can include silane coated, alumina coated, and combinations thereof, specifically silica-methyl hydrogen polysiloxane coated filler. Examples of the surface-treating agent that can be used to form silica, alumina and/or silane coatings can include, without limitation, methyl hydrogen polysiloxane such as APS-219 from Advanced Polymers Inc., MH1107 Fluid from Dow Corning, silane coupling agents such as vinyltrichlorosilane, vinyltrimethoxysilane, vinyltriethoxysilane, vinyltris(β-methoxyethoxy)silane, β-(3,4-epoxycyclohexyl)ethyltrimethoxysilane, γ-glycidoxypropyltrimethoxysilane, γ-glycidoxypropylmethyldiethoxysilane, γ-glycidoxypropyltriethoxysilane, γ-methacryloxypropylmethyldimethoxysilane, γ-methacryloxypropyltrimethoxysilane, γ-methacryloxypropylmethyldiethoxysilane, γ-methacryloxy- propyltriethoxysilane, N-β(aminoethyl)γ-aminopropylmethyldimethoxysilane, N-β(aminoethyl)γ-aminopropyltrimethoxysilane, N-β(aminoethyl)γ-aminopropyltriethoxysilane, γ-aminopropyltrimethoxysilane, γ-aminopropyltriethoxysilane, N-phenyl-γ-aminopropyltrimethoxysilane and γ-mercaptopropyltrimethoxysilane.

The composition of the thermosetting composition for the bond ply comprises a flame retardant. Conventional bromine-containing flame retardants for circuit materials can be used. Examples of suitable bromine flame retardants include Saytex® BT 93W (ethylene bistetrabromophthalide), Saytex® 120 (tetrabromdiphenoxy benzene), Saytex® 102 (decabromo diphenoxy oxide), and Saytex® 8010 (ethane-1,2-bis(pentabromo phenyl)).

The bromine-containing flame retardant ethylene bistetrabromophthalide, for example, can be represented by the following structure:

wherein such compounds are characterized by the presence of a plurality of (two or more, specifically two to four) brominated aromatic rings In some embodiments, the bond ply comprises, as a halogen-free flame retardant, an effective amount of a dihydro-oxa-phospho-phenantrene (DOPO) derivative. Such compounds, in sufficient amount in terms of weight percent and in proper combination with inorganic filler in terms of volume percent, can attain a desirable V-0 rating according to UL-94 (Underwriter's Laboratories Subject 94) and other excellent ratings in related test methods, including glass-fiber reinforced formulations where conventional fire retardant systems tend to fail. In some embodiments, a glass-fiber reinforced dielectric layer is combined with an optionally reinforced bond ply.

Such DOPO derivatives can have a relatively high temperature of volatization. In one embodiment, the compounds start decomposition or volatilization at 310° C. and achieve at least 70% by weight decomposition or volatization by 450° C. The peak melting point of the compound is higher than DOPO (the mono-compound) and specifically at least about 260° C., more specifically 260 to 320° C., most specifically 275 to 305° C.

In a DOPO derivative, which is used in both the dielectric substrate and the bond ply layer described herein, the oxaphosphorinoxide group comprises a phosphorous atom and one oxygen atom as part of an organocyclic structure, particularly a five or six membered ring. According to some embodiments, an oxaphosphorinoxide-containing moiety can be represented by the following structural formula:

(1)

wherein each $R^1$ and $R^2$ can independently represent hydrogen or a $C_1$-$C_6$ hydrocarbyl group, specifically a $C_1$-$C_4$ alkyl group, and each m can independently represent an integer from 1 to 4. In structure (1), the dotted line represents a monovalent bond. When the bond is attached to a hydrogen atom, the resulting compound can be named as 6H-dibenz [c,e][1,2]oxaphosphorin-6-oxide, 3,4:5,6-dibenzo-2H-1,2- oxaphosphorin-2-oxide or 9,10-dihydro-9-oxa-10-phosphorylphenanthrene-10-oxide, abbreviated as DOPO(CAS RN 35948-25-5). Such compound is commercially available from Sanko Co, Ltd.

The DOPO-containing compounds can be characterized by the presence of two or three oxaphosphorinoxide-containing moieties. These moieties can be connected with a bivalent or trivalent bridging group Q. Such compounds can be represented by the following structure:

(2)

wherein $R^1$, $R^2$, and m are defined above, Q can represent a $C_{1-24}$ hydrocarbyl, and n is on average 2 to 4. When n is 2, the compound can be referred to as a DOPO dimer or di-DOPO compound.

In one embodiment, the DOPO derivative has the following structure:

(4)

wherein B is a direct bond, $C_6$-$C_{12}$ aryl, $C_3$-$C_{12}$ cycloalkyl, or a $C_3$-$C_{12}$ cycloalkenyl, wherein said cycloalkyl or cycloalkenyl may be optionally substituted by a $C_1$-$C_6$ alkyl; each $R^1$, $R^2$, $R^3$ and $R^4$ are independently hydrogen, $C_1$-$C_{15}$ alkyl, $C_6$-$C_{12}$ aryl, $C_7$-$C_{15}$ aralkyl or $C_7$-$C_{15}$ alkaryl; or $R^1$ and $R^2$ or $R^3$ and $R^4$ taken together can form a saturated or unsaturated cyclic ring, wherein said saturated or unsaturated cyclic ring may be optionally substituted by a $C_1$-$C_6$ alkyl; each m is independently 1, 2, 3 or 4; each $R^5$ and $R^6$ are independently hydrogen or a $C_1$-$C_6$ alkyl; and each n is independently 0, 1, 2, 3, 4 or 5; with the proviso that when B is aryl or a direct bond, n cannot be 0.

In one embodiment, both n subscripts are 1 or 2 and B is a direct bond. In another embodiment, both n subscripts are 1, and B is a $C_6$-$C_{12}$ aryl. In still another embodiment, $R^1$, $R^2$, $R^3$ and $R^4$ are independently hydrogen or a $C_1$-$C_6$ alkyl. In another embodiment, $R^5$ and $R^6$ are each independently hydrogen or methyl.

Specific compounds of Structure (4) that can be used in this invention are 6H-Dibenz[c,e][1,2] oxaphosphorin, 6,6'-(1,4-ethanediyl)bis-, 6,6'-dioxide; 6H-Dibenz[c,e][1,2]oxaphosphorin, 6,6'-(1,4-butanediyl)bis-, 6,6'-dioxide; or 6H-Dibenz[c,e][1,2] oxaphosphorin, 6,6'-(p-xylenediyl)bis-, 6,6'-dioxide.

The DOPO-containing compounds defined above are known compounds, are commercially available, and/or can be prepared by known methods. In one embodiment, the DOPO derivative comprises a compound that can be represented by Structure (5):

(5)

In Structure (5), each $R^1$, $R^2$, $R^3$ and $R^4$ are independently hydrogen, $C_1$-$C_{15}$ alkyl, $C_6$-$C_{12}$ aryl, $C_7$-$C_{15}$ aralkyl or $C_7$-$C_{15}$ alkaryl; or $R^1$ and $R^2$ or $R^3$ and $R^4$ taken together can form a saturated or unsaturated cyclic ring, wherein said saturated or unsaturated cyclic ring may be optionally substituted by a $C_1$-$C_6$ alkyl; each m is independently 1, 2, 3 or 4; and n is 2 to about 12, specifically 2 to 6, more specifically 2 to 3.

A specific embodiment of the compound of Structure (5) can be represented by Structure (6):

(6)

This compound is (6H-Dibenz[c,e][1,2]oxaphosphorin, 6,6'-(1,2-ethanediyl)bis-, 6,6'-dioxide)

The peak melting point of the DOPO derivative in the present composition can be greater than about 240° C., specifically about 240 to 310° C., more specifically 274 to 305° C. For determining peak melting point, a differential scanning calorimeter (DSC) may be used such as a TA Instruments Q2000 analyzer with standard calibration according to the instrument manufacturers recommended procedures. The peak melting point is the maximum endotherm for a particular melting transition.

In one embodiment, the DOPO derivative is a high melting point optical isomer (R,S diastereomer) having the following Structure (7):

(7)

In general, the oxaphosphorinoxide-containing aromatic compound can be added to the thermosetting composition for a dielectric substrate in an amount of about 10 to 35 wt. %, specifically 15 to 30 wt. %, more specifically at least 20 wt. %, based on the total composition. Based on total resin, i.e. resin system (including all polymers and oligomers or reactive diluents that become part of the resin system, but not including inorganic filler or non-reactive additives), the amount of oxaphosphorinoxide-containing aromatic compound is greater than 90 wt. %, specifically 90 wt. % to 130 wt. %, more specifically 95 to 120 wt. %, based on the weight of resin components only. The amount of the oxaphosphorinoxide-containing aromatic compound in the dielectric substrate composition can be selected so that the composition will have a phosphorous content of about 1 wt. % to about 10 wt. %, specifically 2 to 5 wt. %, based on the total composition.

The oxaphosphorinoxide-containing aromatic compound can be ground or milled prior to combining with the resin system. The $d_{50}$ particle size after grinding or milling can be less than about 15 micrometers, specifically less than about 3 micrometers.

In addition to the one or more of the polymers described above, the composition for bond ply layer can further optionally independently comprise additives such as curing agents, stabilizers, and antioxidants. The particular choice of additives are selected so as to enhance or not substantially adversely affect adhesion to a conductive layer, dielectric constant, dissipation factor, water absorbance, and/or other desired properties of the bond ply.

Curing agents for use in the bond ply or thermosetting composition of other layers can include those useful in initiating cure of the relevant polymers. Examples include, but are not limited to, azides, peroxides, sulfur, and sulfur derivatives. Free radical initiators are especially desirable as cure initiators. Examples of free radical initiators include peroxides, hydroperoxides, and non-peroxide initiators such as 2,3-dimethyl-2, 3-diphenyl butane. Examples of peroxide curing agents include dicumyl peroxide, alpha, alpha-di(t-butylperoxy)-m,p-diisopropylbenzene, 2,5-dimethyl-2,5-di(t-butylperoxy)hexane-3, and 2,5-dimethyl-2,5-di(t-butylperoxy)hexyne-3, and mixtures comprising one or more of the foregoing cure initiators. The cure initiator, when used, is typically present in an amount of about 0.25 wt. % to about 15 wt. %, based on the total weight of the adhesive composition.

Suitable antioxidants for use in any one or more of the layers in the circuit subassembly can include radical scavengers and metal deactivators. A non-limiting example of a free radical scavenger is poly[[6-(1,1,3,3-tetramethylbutyl) amino-s-triazine-2,4-dyil][(2,2,6,6,-tetramethyl-4-piperidyl)imino]hexamethylene[(2,2,6,6-tetramethyl-4-piperidyl) imino]], commercially available from Ciba Chemicals under the trade name Chimmasorb® 944. A non-limiting example of a metal deactivator is 2,2-oxalyldiamido bis[ethyl 3-(3, 5-di-t-butyl-4-hydroxyphenyl)propionate] commercially available from Uniroyal Chemical (Middlebury, Conn.) under the trade name Naugard® XL-1. A single antioxidant or a mixture of two or more antioxidants can be used. Antioxidants are typically present in amounts of up to about 3 wt. %, specifically about 0.25 to about 2.0 wt. %, based on the total weight of the adhesive composition.

The thermosetting composition for the dielectric substrate layer in a circuit subassembly is a low polarity composition (inclusive of non-polar compositions). Thus, substantial amounts of epoxy-containing resins are excluded, specifically absent. While the thermosetting composition is a low polarity, low dielectric constant, and low loss material, it may tend, however, to be highly flammable when formulated without flame retardant additives. In one embodiment, the thermosetting composition is based on a thermosetting resin that has an LOI (limited oxygen index) of less than 20 and comprises at least two (specifically, on average, two or more) free-radically reactive functional groups, specifically groups having an ethylenically unsaturated double bond. The thermosetting composition can have a combined bromine and chlorine content of less than about 900 ppm.

Examples of thermosetting compositions for a dielectric substrate, in a circuit subassembly having a bond ply layer, can include those based on thermosetting resins such as 1,2-polybutadiene, polyisoprene, polybutadiene-polyisoprene copolymers, poly(phenylene ether) resins, curable cyclic olefins or their copolymers (such as the copolymers described in US patent publications 2008/0259234 and 2011/0060096), hereby incorporated by reference in their entirety. The thermosetting resin can be functionalized with a reactant compound to contain ethylenically unsaturated double bonds. For example, the thermosetting resin can be vinylated, allylated, methacrylated, or maleinated to comprise free-radically reactive ethylenically unsaturated double bonds. In one embodiment, the thermosetting composition is based on a vinyl-terminated polybutadiene and/or a vinyl or allyl terminated poly(phenylene ether). The vinyl or allyl terminated poly(phenylene ether) can have a number average molecular weight of less than 4,000. Such low molecular weight vinyl or allyl terminated poly(phenylene ether) resin is commercially available from Mitsubishi Gas under the trade name of MGC OPE-2St and Xyron®-modified polymers from Asahi Kasei. Still other co-curable polymers that can be added for specific property or processing modifications include, but are not limited to, homopolymers or copolymers of ethylene such as polyethylene and ethylene oxide copolymers; methaclated PPO (polyphenylene oxide) resins such as SA9000, which is reactive with polybutadiene in the same composition; natural rubber; norbornene polymers such as polydicyclopentadiene; hydrogenated styrene-isoprene-styrene copolymers and butadiene-acrylonitrile copolymers; unsaturated polyesters; and the like. Levels of these copolymers are generally less than 50 vol. % of the resin system.

Such thermosetting resins can exhibit the desirable features of low dielectric constant and low loss. Combinations of low polarity resins with minor amounts of higher polarity resins can also be used, non-limiting examples including epoxy and poly(phenylene ether), and cyanate ester and poly(phenylene ether). Compositions based on polybutadiene, polyisoprene, and/or butadiene- and isoprene-containing copolymers are especially useful. To state that a thermosetting composition is "based on" one or more thermosetting resins means that the thermosetting composition comprises more of that thermosetting resin than any other resin, specifically greater than 50 wt. % of the total resin (including reaction monomers and oligomers, exclusive of filler) used to make the dielectric substrate, including reactive monomers. Particularly suitable thermosetting compositions comprise, or are based on, thermosetting polybutadiene and/or polyisoprene resin, as that term is used herein, including homopolymers and copolymers comprising units derived from butadiene, isoprene, or mixtures thereof.

The thermosetting resin, specifically the polybutadiene and/or polyisoprene resin, can be present in the resin system of the dielectric substrate layer in an amount of 50 to 100 wt. %, specifically about 35 to 85 wt. % based on total resin, optionally in combination with up to 30 wt. %, specifically up to 15 wt. % based on total resin of compounds selected from the group consisting of bis(vinyl phenyl) methane, bis(vinyl phenyl)ethane, bis(vinyl phenyl) hexane, and combinations thereof. Alternatively, the polybutadiene and/or polyisoprene resin can be present in an amount, based on the thermosetting composition (including filler) of about 5 to about 55 wt. %, more specifically about 10 to about 45 wt. %. Other polymers or compounds that can co-cure with the thermosetting polybutadiene and/or polyisoprene resins can be added for specific property or processing modifications. For example, in order to improve the stability of the dielectric strength and mechanical properties of the electrical substrate material over time, a lower molecular weight ethylene propylene elastomer can be used in the resin systems. An ethylene propylene elastomer as used herein is a copolymer, terpolymer, or other polymer comprising primarily ethylene and propylene. Ethylene propylene elastomers can be further classified as EPM copolymers (i.e., copolymers of ethylene and propylene monomers) or EPDM terpolymers (i.e., terpolymers of ethylene, propylene, and diene monomers). Ethylene propylene diene terpolymer rubbers, in particular, have saturated main chains, with unsaturation available off the main chain for facile cross-linking. Liquid ethylene propylene diene terpolymer rubbers, in which the diene is dicyclopentadiene, are preferred.

A circuit subassembly comprising a bond ply, as described herein, used to bond two circuit laminates can further optionally comprises a protective adhesive layer, in between and in direct contact with a dielectric substrate layer and conductive layer, particularly when using organo-phosphorus flame-retardant compounds. Such adhesive layer can provide chemical resistance properties with respect to the thermosetting composition in a circuit laminate, particularly in the case of base exposure during circuit manufacturing processes. This improvement can allow improved resistance to degradation during processing involving a strong base.

In the case of circuit subassemblies comprising high profile copper or low profile copper, the protective adhesive layer can protect the dielectric substrate layer from exposure to high pH basic solution that can attack some flame-retardant compounds contained in the dielectric substrate layer. In particular, without wishing to be bound by theory, it is believed that basic, or high pH, solution can dissolve or react with some oxaphosphorinoxide-containing aromatic flame-retardant compounds, for example, and to some extent remove or leach them from the dielectric substrate during processing of the circuit material. For example, the oxaphosphorinoxide-containing aromatic compound, specifically the DiDOPO compound of structure (7), when incorporated into non-polar resin thermosetting compositions, has been found to be soluble in, and reactive with, alkaline solution. (In contrast, the use of brominated fire retardant compounds can avoid this problem.) Since such alkaline solutions are often used during some of the processes used to manufacture printed circuit boards, the flame retardant properties of the oxaphosphorinoxide-containing aromatic compound can be protected by a thin layer of adhesive material, thereby improving resistance to basic solutions. At the same time, the protective adhesive layer should not cause a significantly adverse effect on the desired electrical properties of the resultant circuit laminate, such as low dielectric constant, low dissipation factor, low water absorption, and improved dielectric breakdown strength.

Exemplary compositions for a protective adhesive layer, for use in a circuit subassembly comprising the bond ply, are disclosed in U.S. Pat. No. 8,431,222 to Paul, hereby incorporated by reference in its entirety. The relative amount of components in the protective adhesive layer or the bond ply layer can depend on the particular substrate material used, the desired properties of the circuit materials and circuit laminates, and like considerations. The use of poly(arylene ether) can contribute to increased bond strength between a conductive metal layer, particularly copper, and a relatively nonpolar dielectric substrate material, and also can make the dielectric substrate layer or partially cured prepreg less tacky so that there is little or no blocking and so that repositioning during cladding is easier. The use of polybutadiene or polyisoprene polymer provides increases high temperature resistance of a laminate, particularly when the polymers are carboxy-functionalized. The use of an elastomeric block copolymer can function to compatibilize the components of the adhesive.

In view of the above, such an optional protective adhesive layer can be directly applied to a conductive layer or a dielectric substrate layer (e.g., a prepreg or a B-staged material) as a coating (if of sufficiently low viscosity) or dissolved or suspended (i.e., in the form of a solution) that can be applied to a surface by known methods in the art, for example by dip, spray, wash, printing or other suitable coating technique. Where a solvent is present, the solution is allowed to dry under ambient conditions, or by forced or heated air, to form an adhesion promoting layer. In some embodiments, the coating weight of the protective adhesive layer is about 2 grams per square meter ($g/m^2$ or "gsm") to about 15 $g/m^2$, specifically about 3 $g/m^2$ to about 12 $g/m^2$, more specifically 5 to 10 $g/m^2$. The protective adhesive layer can be uncured or partially cured in a drying process.

Useful conductive layers for the formation of the circuit laminates, multilayer circuit laminates can include, without limitation, stainless steel, copper, gold, silver, aluminum, zinc, tin, lead, transition metals, and alloys comprising at least one of the foregoing, with copper being exemplary. There are no particular limitations regarding the thickness of the conductive layer, nor are there any limitations as to the shape, size or texture of the surface of the conductive layer. Specifically, however, the conductive layer comprises a thickness of about 3 micrometers to about 200 micrometers, specifically about 9 micrometers to about 180 micrometers. When two or more conductive layers are present, the thickness of the two layers can be the same or different.

Figure 1:
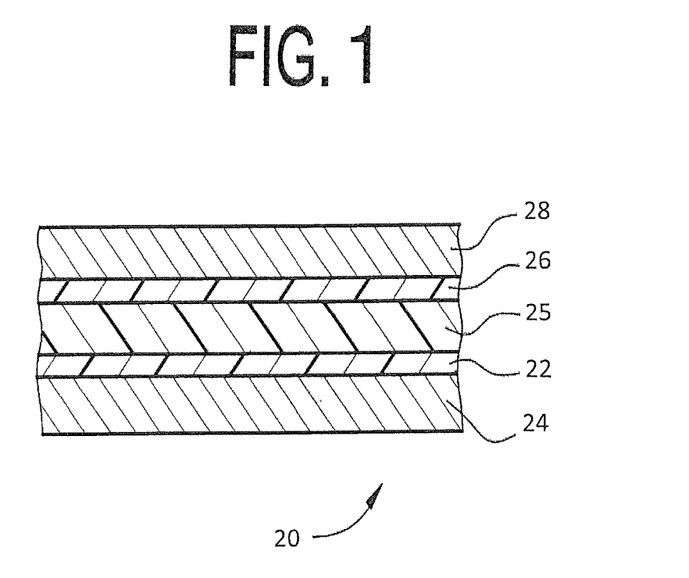
FIG. 1 shows an exemplary double clad circuit laminate comprising a dielectric layer, two adhesive protectivelayers, and two conductive layers.

FIG. 1 shows an exemplary double clad circuit laminate 20 comprising a first protective adhesive layer 22 disposed between a first conductive layer 24 and a first side of a dielectric circuit substrate 25. As used herein, "disposed" means at least partial direct contact, without any intervening layers, between conductive layer copper foil and the protective adhesive layer. It is to be understood that in all of the embodiments described herein, the various layers can fully or partially cover each other, and additional copper foil layers, patterned circuit layers, and dielectric layers can also be present. Second adhesive protective layer 26 is disposed between second conductive layer 28 and a second side of circuit substrate 25. The first and second adhesive layers 22, 26 can comprise the same or different polymer composition, and first and second conductive layers 24, 28 can comprise the same or different types of conductive layer, e.g. copper foil. As discussed above, the adhesive layers are optional.

Figure 2:
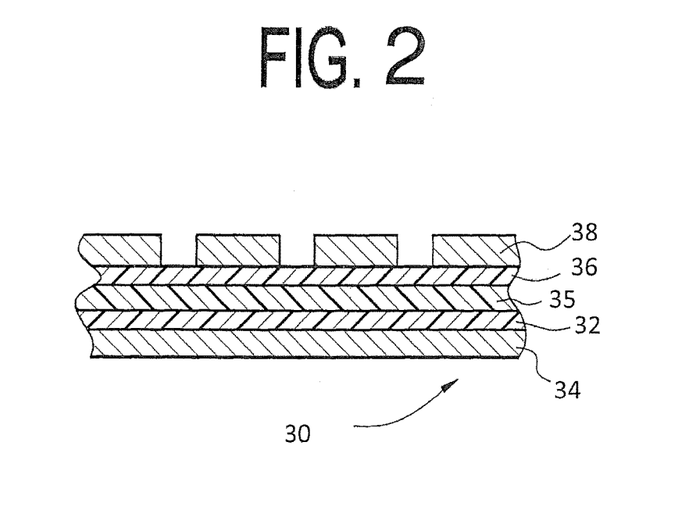
FIG. 2 shows an exemplary double clad circuit in which one of the two conductive layers have been patterned.

FIG. 2 shows an exemplary double clad circuit 30 comprising a first protective adhesive layer 32 disposed between a first conductive layer 34 and a first side of a dielectric circuit substrate 35. Second adhesive protective layer 36 is disposed between a patterned (e.g., etched) circuit layer 38 and a second side of dielectric circuit substrate 35. The first and second adhesive layers 32, 36 can comprise the same or different polymer composition. The adhesive layers are optional.

Various multilayer circuits can be made by using a bond ply to bond multiple layers of circuit subassemblies into a single stacked circuit containing many circuitized conductive layers. Exemplary circuit subassemblies can include, without limitation, single clad laminates, double clad laminates, and the like. A single clad laminate, for example, comprises a conductive metal layer disposed on and in contact with a dielectric substrate layer. It is to be understood that in all of the embodiments described herein, the various layers can fully or partially cover each other, and additional conductive layers, patterned circuit layers, and dielectric layers can also be present. Optional adhesive layers (not shown) can also be present. A double clad circuit laminate comprises two conductive layers disposed on opposite sides of a dielectric substrate layer. One or both of the conductive layers can be in the form of a circuit.

Typically, circuit subassemblies comprising a bond ply can be formed by laminating two or more (patterned or unpatterned) double clad laminates together using one or more bond plies in proper alignment using heat and/or pressure. Patterning after lamination is another option. A double clad laminate can have two conductive layers, one on each side of the substrate. Patterning a conductive layer, for example by etching, provides a circuit layer, and thus a circuit in a circuit laminate. (A circuit laminate is a single or double clad laminate that has one or more circuit layers.) Thus, bond plies can be used to provide adhesion between various layers or laminates.

It is desirable that a bond ply is capable of withstanding the processing temperatures encountered during component mounting. One common requirement for "lead-free" soldering is that the multilayer assembly survives 10 seconds at a temperature of 288° C. without delamination. One material property that is often indicative of the ability to survive the 10 seconds at 288° C. is the "decomposition temperature," $T_d$. The decomposition temperature is measured using a thermogravimetric analyzer (TGA). The material to be tested is placed in the TGA and the temperature is increased at a rate of 10° C./minute. The $T_d$ is defined as the temperature at which the cumulative weight loss reaches 5%. In order to survive the 10 seconds at 288° C. delamination test, the $T_d$ needs to be greater than about 290° C. Bond plies can have a melting point between 250° C. and 370° C., a decomposition temperature greater than about 290° C. and a dissipation factor of less than 0.01 at 10 GHz.

In general, bond ply compositions can be processed as follows. First, all components (bond ply resins and optional additives) are thoroughly dissolved or suspended in solvent and cast onto glass fabric or onto a releasable substrate such as siliconized Mylar® polyester film. The mixing temperature is regulated to avoid substantial decomposition of the components. Mixing continues until resins and additives are uniformly dispersed throughout the composition. In one embodiment, a circuit assembly in accordance with the invention is manufactured by forming a stack comprising a bond ply layer disposed between one or more single or double clad circuit laminates, and laminating the multilayer stack. The bond ply layer can be formed from one or more bond plies or bond ply prepregs (i.e. materials pre-impregnated with other materials). (Similarly, the dielectric substrate layer can be formed from one or more dielectric substrate layers or prepregs.) Most commonly, at least one conductive layer of the single or double clad circuit laminate will be etched to provide a circuit in the subassembly comprising a bond ply. Suitable conditions for the lamination can be readily determined by one of ordinary skill in the art without undue experimentation using the guidance provided herein, and will depend on factors such as the softening or melt temperature of the resin and the thickness of the substrate. Exemplary conditions are 150-320° C., 50-500 pounds per square inch (psi) (0.345-3.45 MPa) for up to about three hours. Additional layers can be present, for example, additional conductive layers, substrates, bond ply layers and/or other layers, to make a circuit subassembly.

Figure 3:
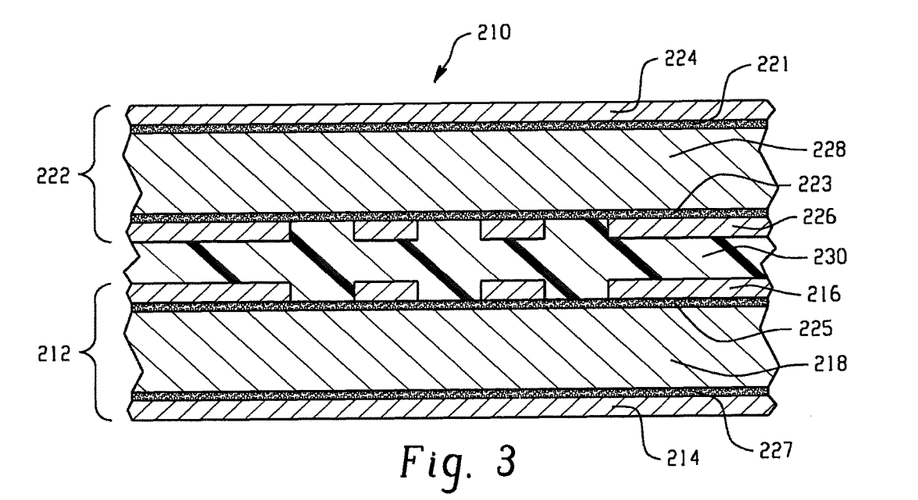
FIG. 3 shows an exemplary multilayer circuit comprising two circuit layers constructed from two double clad laminates.

Many different multilayer circuit configurations can be formed using bond layers. An exemplary embodiment is shown in FIG. 3, wherein a multilayer circuit assembly is shown at 210. Assembly 210 comprises a double clad circuit layer 212 comprising a conductive layer 214 and a circuit layer 216 on opposite sides of a dielectric substrate layer 218, and another double clad circuit layer 222 comprising a conductive layer 224 and a circuit layer 226 on opposite sides of a dielectric substrate layer 228. The dielectric layers 218, 228 are optionally the same composition. Bond ply layer 230 is a thermoplastic or thermosetting material as described above. One or all of the dielectric layers 218, 228, and/or bond ply layer 230 can comprise a woven web and/or a particulate filler (not shown). One or both of conductive layers 214, 224 can be circuitized (not shown). Protective adhesive layers 221, 223, 225, and 227 are optionally disposed between each conductive layer or circuit and its dielectric substrate layer.

Figure 4:
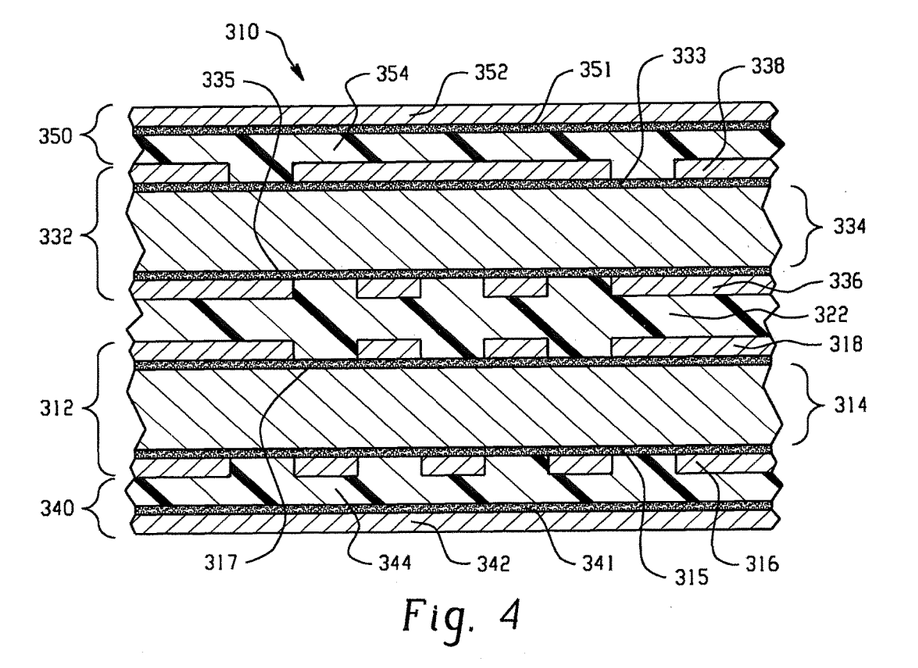
FIG. 4 shows an exemplary multilayer circuit comprising three circuit layers constructed from double clad laminates.

FIG. 4 shows an exemplary circuit assembly 310 having a first double clad circuit 312, a second double clad circuit 332, and a bond ply 322. Double clad circuit 312 comprises a dielectric substrate 314 between two conductive circuit layers 316, 318. Double clad circuit 332 comprises a dielectric substrate 334 located between two conductive circuit layers 336, 338. At least one, and specifically both, of dielectric layers 314, 334 has the composition disclosed herein. Each dielectric substrate layer 314, 334 can comprise, in addition to particulate filler, a nonwoven glass reinforcement (not shown). Two cap layers, 340, 350 are also shown. Each cap layer 340, 350 includes a conductive layer 342, 352 over a bond ply layer 344, 354. Protective adhesive layers 351, 333, 335, 317, 315, and 341 are optionally disposed between each conductive layer or circuit and its dielectric substrate layer.

As mentioned above, such circuit subassemblies comprising the bond ply disclosed herein can provide significant advantages. As indicated previously, such circuit subassemblies disclosed herein, comprising a fire retardant, can achieve UL94 flame retardance ratings of V-1 or better (V-1 or V-0) while also can provide excellent electrical properties The subassemblies can have a UL94 rating of at least V-1 at a thickness of 40 mil and a UL94 V-0 rating at a thickness up to 60 mil, without the use of halogenated flame retardants. UL94 is an Underwriters Laboratories flammability test that provides four possible ratings, HB, V-2, V-1, and V-0. V-0 is the most difficult rating to obtain, requiring that five bars of material self-extinguish with an average flame out time of ten seconds or less without dripping.

In addition, such circuit assemblies can have low water absorption, generally less than about 0.5%, specifically less than about 0.3%. Resistance to the acidic or basic solutions used in conventional circuit fabrication can be high.

Regarding electrical properties, the bond ply disclosed herein, or circuit subassemblies comprising the same, can have electrical and thermal properties consistent with those desired in circuits for high frequency and high data speed electrical and electronic applications. Specifically, such circuit materials can have a $D_f$ (dissipation factor) of less than 0.006 at 10 GHz and a $D_k$ (dielectric constant) of less than 3.8 at 10 GHz. $D_f$ is a measure of loss-rate of electrical potential energy in a dielectric material, usually in the form of heat. Thus, $D_f$ determines the "lossiness" of a material. A low dielectric loss is desired for high-speed interconnects and operation at high frequencies in a printed circuit assembly.

The invention is further illustrated by the following non-limiting Examples.

EXAMPLES

The materials listed in Table 1 were used in the following examples to demonstrate the advantages of specified bond ply compositions.

EXAMPLES

The following examples demonstrate the performance of a bond ply according the present invention. Various bond plies having the composition set forth in Tables 2 (Example 1), 3 (Example 2), 4 (Example 3), and 5 (Example 4) below were prepared. The bond ply of Table 2 comprising a phosphorus-containing flame retardant. The bond ply of Table 3 is a high $D_k$ material ($D_k$ of about 6.15) and the bond ply of Table 4 is a low $D_k$ material (a $D_k$ of about 3.0 to 3.5), each comprising a bromine-containing fire retardant.

The resins, inorganic filler, and all other components are thoroughly mixed to form a slurry in conventional mixing equipment. The mixing temperature is regulated to avoid substantial decomposition of the curing agent (and thus premature cure).

TABLE 2

| Component | % Total | % Dry | pphr | SG* | Volume | Vol. % |
|---|---|---|---|---|---|---|
| Elastomer resin | 3.79 | 5.34 | .1688 | 0.94 | 0.0568 | 8.24 |
| Silane | 0.20 | 0.28 | 0.0087 | 1.044 | 0.0026 | 0.38 |
| Stabilizer | 0.22 | 0.31 | 0.0097 | 1.04 | 0.0030 | 0.43 |
| Reactive monomer | 1.42 | 2.00 | 0.0633 | 0.84 | 0.0238 | 3.46 |
| PB resin 1 | 8.52 | 12.01 | 0.3797 | 0.97 | 0.1238 | 17.97 |
| TAIC | 3.32 | 4.67 | 14.77 | 1.044 | 0.0447 | 6.49 |
| PPO resin | 5.40 | 7.61 | 0.2405 | 1.02 | 0.0746 | 10.82 |
| DOPO FR | 21.31 | 30.02 | 0.9494 | 1.52 | 0.1975 | 28.66 |
| Silica 3 | 21.51 | 30.30 | 0.9583 | 2.2 | 0.1377 | 20.0 |
| Titanium oxide | 4.74 | 6.67 | 0.2110 | 4.1 | 0.0163 | 2.36 |
| Curing agent | 0.57 | 0.800 | 0.0253 | 0.97 | 0.0083 | 1.20 |
| Xylene | 29.01 | — | — | — | — | — |

*Specific gravity (SG) is measured at room temperature or 23° C.

TABLE 1

| Material name | Chemical name |
|---|---|
| PB resin 1 | Vinyl-terminated oligomeric polybutadiene resin, vinyl content 88%, MW of 3000 Da (about 56 monomer units) |
| PB resin 2 | Vinyl-terminated oligomeric polybutadiene resin, vinyl content 88%, MW of 1000 Da |
| PPO resin | Polyphenylene ether, vinyl terminated or methacrylated |
| Elastomer Resin | SB (styrene-butadiene) diblock copolymer (20%) and SBS triblock copolymer (80%) |
| TAIC | Triallyl cyanurate. CAS 101-37-1 |
| Brominated aromatic compound | Fire Retardant, ethylene bistetrabromophthalide (Saytex ® BT93W). |
| DOPO-containing aromatic compound | High melt diDOPO compound of predominantly structure (7) herein from Albermarle Corp. |
| Silane | Aminosilane |
| Reactive Monomer | Ethylene propylene dicyclopentadienene monomer liquid rubber |
| Silica 1 | Fused silica. Particle size ≤100 µm. (CE44I ® from C.E. Minerals, TN.) |
| Silica 1 | Fused silica. Particle size ≤100 µm. (Teco-Sil ® CE44IR from C.E. Minerals, TN.) |
| Silica 3 | Spherical fused silica. Particle size ≤100 µm. (Teco DS ® from C.E. Minerals, TN.) |
| Silica 4 | Spherical fused silica. Particle size ≤20 µm (Denka ® FB-8S from Denka.) |
| Silica 5 | Fused silica. Particle size ≤20 µm. (BSI 1-88 ® from Brookes Services, Inc. |
| Titanium Oxide | Titanium oxide. Particle size 0.3 µm |
| AO | 2,2'-oxamidobis-[ethyl-3-(3,5-di-t-butyl-4-hydroxyphenyl) propionate], antioxidant for rubber. |
| Curing agent | Dialkyl peroxide.(Vul Cup ®) |
| Stabilizer | High molecular weight hindered amine light stabilizer (HALS). |
| Cu foil | High profile copper foil. |

TABLE 3

(High $D_k$ Bond Ply with Brominated Fire Retardant)

| Description: | % Total | % Dry | pphr | SG | Volume | Vol. % |
|---|---|---|---|---|---|---|
| Elastomer resin | 3.75% | 5.63% | 0.1877 | 0.94 | 0.0600 | 11.60 |
| Silane | 0.27% | 0.40% | 0.0133 | 1.044 | 0.0038 | 0.74 |
| Stabilizer | 0.20% | 0.29% | 0.0098 | 1.04 | 0.0028 | 0.55 |
| Reactive Monomer | 0.98% | 1.47% | 0.0491 | 0.84 | 0.0175 | 3.40 |
| PB Resin 1 | 7.27% | 10.91% | 0.3636 | 0.97 | 0.1125 | 21.79 |
| TAIC | 2.99% | 4.48% | 0.1494 | 1.044 | 0.0429 | 8.32 |
| PPO Resin | 5.00% | 7.50% | 0.2501 | 1.02 | 0.0736 | 14.25 |
| Brominated FR | 11.41% | 17.11% | 0.5705 | 2.77 | 0.0618 | 11.97 |
| TiO$_2$ | 31.45% | 47.17% | 1.5725 | 4.1 | 0.1150 | 22.29 |
| Silica 1 | 2.95% | 4.42% | 0.1474 | 2.2 | 0.0201 | 3.89 |
| Curing Agent | 0.40% | 0.60% | 0.0201 | 0.97 | 0.0062 | 1.21 |
| Xylene | 33.41 | — | — | — | — | — |

TABLE 4

(Low $D_k$ Bond Ply A with Brominated Fire Retardant)

| Description | % Total | % Dry | pphr | SG | Volume | Vol. % |
|---|---|---|---|---|---|---|
| Elastomer resin | 4.59% | 6.89% | 0.1846 | 0.94 | 0.0733 | 10.21 |
| Silane | 0.22% | 0.32% | 0.0087 | 1.044 | 0.0031 | 0.47 |
| Stabilizer | 0.24% | 0.36% | 0.0097 | 1.04 | 0.0035 | 0.53 |
| AO (Naugard ® XL-1) | 0.06% | 0.08% | 0.0022 | 1.04 | 0.0008 | 0.12 |
| Reactive Monomer (Trilene ® 65) | 1.57% | 2.36% | 0.0633 | 0.84 | 0.0281 | 4.28 |
| PB Resin 1 | 8.49% | 12.75% | 0.3418 | 0.97 | 0.1314 | 22.26 |
| TAIC | 3.67% | 5.51% | 0.1477 | 1.044 | 0.0528 | 8.04 |
| PPO Resin | 6.52% | 9.80% | 0.2627 | 1.02 | 0.0961 | 13.41 |
| Brominated FR | 14.41% | 21.64% | 0.5802 | 2.77 | 0.0781 | 11.91 |
| Silica 4 | 26.20% | 39.35% | 1.0549 | 2.2 | 0.1788 | 27.27 |
| Initiator | 0.63% | 0.94% | 0.0253 | 0.97 | 0.0097 | 1.48 |
| Xylene | 33.32 | — | — | — | — | — |

TABLE 5

(Low $D_k$ Bond Ply B with Brominated Fire Retardant)

| Description | % Total | % Dry | pphr | SG | Volume | Vol. % |
|---|---|---|---|---|---|---|
| Elastomer resin | 7.61% | 11.45% | 0.2976 | 0.94 | 0.1218 | 18.53 |
| Silane | 0.26% | 0.39% | 0.0101 | 1.044 | 0.0037 | 0.57 |
| Stabilizer | 0.25% | 0.38% | 0.0098 | 1.04 | 0.0036 | 0.55 |
| PB Resin 1 | 7.77% | 11.68% | 0.3036 | 0.97 | 0.1204 | 18.31 |
| TAIC | 3.81 | 5.72 | 0.1488 | 1.044 | 0.0548 | 8.34 |
| PPO Resin | 6.40% | 9.62% | 0.2500 | 1.02 | 0.0943 | 14.34 |
| Brominated FR | 15.53% | 23.36% | 0.6071 | 2.77 | 0.0843 | 12.82 |
| Silica 5 | 24.36% | 36.64% | 0.9524 | 2.2 | 0.1665 | 25.33 |
| Initiator | 0.51% | 0.77% | 0.0200 | 0.97 | 0.0079 | 1.21 |
| Toluene | 33.50 | — | — | — | — | — |

Based on the formulation of Table 2 (Halogen-Free Bond Ply), it can be calculated that the volume percent resin is 46.98%, and the volume percent filler is 22.35%. The weight ratio of the polybutadiene resin to the poly(phenylene oxide) resin is 1.58. The volume percent of phosphorus-containing fire-retardant compound is 28.66%. The volume percent of inorganic filler plus fire retardant compound is 51.02%. The volume percent of liquid resin is 27.92% The volume percent of the nitrogen-containing compound is 6.49% and the volume percent of the polybutadiene, based on total resin, is about 38 percent.

Based on the formulation in Table 3 (High $D_k$ formulation with Brominated Fire Retardant)), it can be determined that the total amount of liquid resin used in formulating the bond ply is about 33.50 volume percent, in combination with filler at about 26.18 vol. % and fire retardant at 11.97 vol. %. It can be further noted that the total volume percent of resin in the bond play is 59.35 volume percent, of which 56.4 volume % is liquid resin. The volume percent of the nitrogen-containing compound is 8.32%, based on total composition (dry), and the volume percent of the polybutadiene, based on total resin, is 36.70 percent.

Based on the formulation of Table 4 (Low $D_k$ Bond Ply A with Brominated Fire Retardant), it can be determined that the total amount of liquid resin used in formulating the bond ply is about 32.38 volume percent, in combination with filler at about 27.28 vol. % and fire retardant at 11.91 vol. %. It can be further noted that the total volume percent of resin in the bond play in 58.20 volume percent, of which 55.6 volume % is liquid resin. The volume percent of the nitrogen-containing compound is 8.05%, based on total composition (dry), and the volume percent of the polybutadiene, based on total resin, is 34.18 percent.

Based on the formulation of Table 5 (Low $D_k$ Bond Ply B with Brominated Fire Retardant), it can be determined that the total amount of liquid resin used in formulating the bond ply is about 26.65 volume percent, in combination with filler at about 25.33 vol. % and fire retardant at 12.82 vol. %. It can be further noted that the total volume percent of resin in the bond play in 59.52 volume percent. The volume percent of the nitrogen-containing compound is 8.34%, based on total composition (dry), and the volume percent of the polybutadiene, based on total resin, is 30.77 percent.

In Runs 1 to 9 of Table 6 below, the indicated components in the composition of the bond ply in Table 4 (low $D_k$ bond ply B) were varied. In these examples, the liquid resin consisted of the polybutadiene resin, the reactive monomer (Trilene®) and the crosslinker (TAIC). During lamination of a circuit subassembly at 350° F. maximum, a fill and flow rank of 1-5 was determined based on the following scale: 1=poor, no flow; 1.5=poor, flow for resin only, 3=good flow for both resin and filler; 5=excellent flow for both resin and filler. The results are shown in Table 6. The bondplies were observed for tackiness on a pass (P) or fail (F) basis.

TABLE 6

| Run | Vol % Liquid Resin | Vol % TAIC | Vol % PBD | Vol % PPO | Vol % Filler | Fill/ Flow | Tackiness |
|---|---|---|---|---|---|---|---|
| 1-1 | 37.99% | 0.00% | 34.06% | 16.19% | 16.68% | 1 to 1.5 | — |
| 1-2 | 37.52% | 0.00% | 33.63% | 15.99% | 24.38% | 1 to 1.5 | — |
| 1-3 | 34.59% | 8.04% | 22.26% | 13.41% | 27.27% | 3 to 5 | P |
| 1-4 | 40.24% | 9.36% | 25.90% | 15.60% | 16.65% | 3 to 5 | P |
| 1-5 | 37.56% | 8.73% | 24.17% | 14.56% | 22.20% | 3 to 5 | P |
| 1-6 | 36.06% | 8.74% | 22.66% | 16.03% | 22.22% | 3 to 5 | P |
| 1-7 | 37.42% | 6.61% | 25.21% | 19.98% | 18.35% | 3 to 5 | P |
| 1-8 | 37.56% | 8.73% | 24.17% | 14.56% | 22.20% | 3 to 5 | P |
| 1-9 | 45.27% | 10.53% | 29.14% | 17.55% | 4.98% | 3 to 5 | F |

Fill and Flow Properties:

The results in Table 6 demonstrate that the presence of the TAIC nitrogen-containing compound was necessary for good fill and flow, whereby both the inorganic filler and resin in the protective adhesive layer was evenly and homogenously distributed in the laminate. In contrast, the results for Comparative Runs 1-1 and 1-2 showed that a bond ply layer lacking TAIC failed in terms of fill and flow during lamination.

Bond Ply Flame Testing:

A bond ply according to the formulation of Tables 2, 3, 4, and 5 contain the same level of flame retardant (measured in parts per hundred resin) as the laminate and to behave similarly. Two measurements were taken at about 0.020 inches and 0.060 inches and both tests showed bond plies to have a UL 94 V-0 rating.

In Table 7 below, test results (fill flow properties) for the bond ply compositions of Tables 2, 3, 4, 5 and, for comparison, a standard bond ply formulation and dielectric substrate compositions, are presented together with relevant formulation details. As before, during lamination of a circuit subassembly at 350° F. maximum, a fill and flow rank of 1-5 was determined based on the following scale: 1=poor, no flow; 1.5=poor, flow for resin only, 3=good flow for both resin and filler; 5=excellent flow for both resin and filler. The results are shown in Table 7.

TABLE 7

| | | Bond Ply | | | | Core Dielectric | |
| | | | | | | For Bond Ply with | |
| Component | Halogen-Free Bond Ply | High $D_k$ Bond Ply | Low $D_k$ Bond Ply A | Low $D_k$ Bond Ply B | Standard Bond Ply | Brominated Fire Retardant | For Halogen-Free Bond Ply |
| --- | --- | --- | --- | --- | --- | --- | --- |
| TAIC (vol %) | 6.49% | 8.32% | 8.05% | 8.34% | 0.00% | 0.00% | 0.00% |
| SA9000 (vol %) | 10.82% | 14.25% | 14.65% | 14.34% | 0.00% | 0.00% | 0.00% |
| Polybutadiene pbd (vol %) | 17.97% | 21.79% | 20.04% | 18.31% | 26.98% | 27.72% | 25.02% |
| pbd in resin (vol %) | 38.25% | 36.70% | 34.44% | 30.77% | 55.76% | 67.90% | 69.08% |
| Kraton (vol %) | 8.24% | 11.60% | 11.17% | 18.53% | 10.41% | 8.25% | 9.03% |
| Liquid resin (volume %) | 27.92% | 33.50% | 32.38% | 26.65% | 32.81% | 32.57% | 27.18% |
| Filler plus FR (vol %) | 51.02% | 38.15% | 39.19% | 38.15% | 48.36% | 57.30% | 60.83% |
| Filler (vol %) | 22.35% | 26.18% | 27.28% | 25.33% | 38.39% | 51.10% | 36.88% |
| Fill Flow properties | 3 to 5 | 3 to 5 | 3 to 5 | 3 to 5 | 1 to 1.5 | 1 to 1.5 | 1 to 1.5 |

Discussion of Results:

In Table 7 above, it can be seen that the standard bond ply and the dielectric substrate compositions provided poor fill-flow properties, whereas the four inventive examples provided good fill-flow properties. Two compositional differences between the bond plies having good fill flow properties and the bond plies and dielectric layers having poor fill flow properties are apparent. The first is that all good fill-flow products in Table 7 include between about 5 and 10% of the nitrogen-containing compound, TAIC, according to the present examples. The second is that the volume % filler in Table 7 is less than about 30% for all good fill-flow products in these examples. A third observation is that, in this embodiment, a bond ply having a volume % of polybutadiene in the total resin less than about 40% provided good results. At the same time, the PPO resin was able contribute to a desirable reduction in tackiness before lamination in combination with the improved fill-flow properties.

The singular forms "a," "an," and "the" include plural referents unless the context clearly dictates otherwise. The endpoints of all ranges directed to the same characteristic or component are independently combinable and inclusive of the recited endpoint. All references are incorporated herein by reference. As used herein and throughout, "disposed," "contacted," and variants thereof refers to the complete or partial physical contact between the respective materials, substrates, layers, films, and the like. Further, the terms "first," "second," and the like herein do not denote any order, quantity, or importance, but rather are used to distinguish one element from another.

As used herein, the term "hydrocarbyl" refers broadly to a substituent comprising carbon and hydrogen, optionally with 1 to 3 heteroatoms, for example, oxygen, nitrogen, halogen, silicon, or sulfur; "alkyl" refers to a straight or branched chain monovalent hydrocarbon group; "alkylene" refers to a straight or branched chain divalent hydrocarbon group; "alkylidene" refers to a straight or branched chain divalent hydrocarbon group, with both valences on a single common carbon atom; "alkenyl" refers to a straight or branched chain monovalent hydrocarbon group having at least two carbons joined by a carbon-carbon double bond; "cycloalkyl" refers to a non-aromatic monovalent monocyclic or multicylic hydrocarbon group having at least three carbon atoms, "cycloalkenyl" refers to a non-aromatic cyclic divalent hydrocarbon group having at least three carbon atoms, with at least one degree of unsaturation; "aryl" refers to an aromatic monovalent group containing only carbon in the aromatic ring or rings; "arylene" refers to an aromatic divalent group containing only carbon in the aromatic ring or rings; "alkylaryl" refers to an aryl group that has been substituted with an alkyl group as defined above, with 4-methylphenyl being an exemplary alkylaryl group; "arylalkyl" refers to an alkyl group that has been substituted with an aryl group as defined above, with benzyl being an exemplary arylalkyl group; "acyl" refers to an alkyl group as defined above with the indicated number of carbon atoms attached through a carbonyl carbon bridge (—C(=O)—); "alkoxy" refers to an alkyl group as defined above with the indicated number of carbon atoms attached through an oxygen bridge (—O—); and "aryloxy" refers to an aryl group as defined above with the indicated number of carbon atoms attached through an oxygen bridge (—O—).

Unless otherwise indicated, each of the foregoing groups can be unsubstituted or substituted, provided that the substitution does not significantly adversely affect synthesis, stability, or use of the compound. The term "substituted" as used herein means that at least one hydrogen on the designated atom or group is replaced with another group, provided that the designated atom's normal valence is not exceeded. When the substituent is oxo (i.e., =O), then two hydrogens on the atom are replaced. Combinations of substituents and/or variables are permissible provided that the substitutions do not significantly adversely affect synthesis or use of the compound.

Exemplary groups that can be present on a "substituted" position include, but are not limited to, halogen; cyano;

hydroxyl; nitro; azido; alkanoyl (such as a C2-C6 alkanoyl group such as acyl or the like); carboxamido; alkyl groups (typically having 1 to about 8 carbon atoms, or 1 to about 6 carbon atoms); cycloalkyl groups, alkenyl and alkynyl groups (including groups having at least one unsaturated linkages and from 2 to about 8, or 2 to about 6 carbon atoms); alkoxy groups having at least one oxygen linkage and from 1 to about 8, or from 1 to about 6 carbon atoms; aryloxy such as phenoxy; alkylthio groups including those having at least one thioether linkage and from 1 to about 8 carbon atoms, or from 1 to about 6 carbon atoms; alkylsulfinyl groups including those having at least one sulfinyl linkage and from 1 to about 8 carbon atoms, or from 1 to about 6 carbon atoms; alkylsulfonyl groups including those having at least one sulfonyl linkage and from 1 to about 8 carbon atoms, or from 1 to about 6 carbon atoms; aminoalkyl groups including groups having at least one N atom and from 1 to about 8, or from 1 to about 6 carbon atoms; aryl having 6 or more carbons and at least one ring, (e.g., phenyl, biphenyl, naphthyl, or the like, each ring either substituted or unsubstituted aromatic); arylalkyl having 1 to 3 separate or fused rings and from 6 to about 18 ring carbon atoms, with benzyl being an exemplary arylalkyl group; or arylalkoxy having 1 to 3 separate or fused rings and from 6 to about 18 ring carbon atoms, with benzyloxy being an exemplary arylalkoxy group.

Unless otherwise indicated, all the foregoing groups derived from hydrocarbons may have up to about 1 to about 20 carbon atoms (e.g., $C_1$-$C_{20}$ alkyl, $C_6$-$C_{20}$ aryl, $C_7$-$C_{20}$ alkaryl, $C_7$-$C_{20}$ aralkyl) or 1 to about 12 carbon atoms (e.g., $C_1$-$C_{12}$ alkyl, $C_6$-$C_{12}$ aryl, $C_7$-$C_{12}$ alkaryl, $C_7$-$C_{12}$ aralkyl), or 1 to about 8 carbon atoms, or 1 to about 6 carbon atoms.

While specific embodiments have been shown and described, various modifications and substitutions can be made thereto without departing from the spirit and scope of the invention. Accordingly, it is to be understood that the present invention has been described by way of illustration and not limitation.

What is claimed is:

1. A bond ply layer, having a thickness of 50 to 400 micrometers formed from a composition comprising:
   25 to 45 volume percent of liquid resin comprising polybutadiene and/or polyisoprene and, in addition, a nitrogen-containing compound having allyl groups, wherein the nitrogen-containing compound is present in an amount of 5 to 15 volume percent, based on total composition and the polybutadiene and/or polyisoprene is present in an amount of 20 to less than 60 volume percent, based on the total resin;
   10 to 40 weight percent of a bromine-containing or phosphorus-containing aromatic compound having a peak melting point of at least about 260° C.; and
   5 to 35 volume percent inorganic filler, wherein all percents are calculated based on the bond ply composition absent solvent;
   wherein the bond ply has a UL-94 rating of at least V-1, a $D_f$ of less than 0.006 at 10 GHz and a $D_k$ of 2 to 10 at 10 GHz.

2. The bond ply layer of claim 1, further comprising 1 to 25 volume percent of poly(arylene ether).

3. The bond ply layer of claim 1, wherein the bromine-containing compound has a wt. % bromine (theoretical) of 50 to 80%, a molecular weight of 500 to 2500, and comprises two to four brominated aromatic rings.

4. The bond ply layer of claim 1, wherein the phosphorus-containing aromatic compound is an oxaphosphorinoxide-containing compound represented by the following structure:

wherein each $R^1$ and $R^2$ independently represents hydrogen or a $C_1$-$C_6$ hydrocarbyl group, each m can independently represent an integer from 1 to 4, n is on average 2 to 4, and Q is a $C_2$-$C_{24}$ divalent or trivalent hydrocarbyl group.

5. The bond ply layer of claim 1, wherein the bromine-containing compound is selected from the group consisting of ethylene bistetrabromophthalide, tetrabromdiphenoxy benzene, decabromodiphenoxy oxide, and ethane-1,2-bis (pentabromo phenyl).

6. The bond ply layer of claim 4, wherein the oxaphosphorinoxide-containing aromatic compound is selected from the group consisting of 6H-dibenz[c,e] [1,2] oxaphosphorin, 6,6'-(1,4-ethanediyl)bis-, 6,6'-dioxide; 6H-dibenz[c,e][1,2] oxaphosphorin, 6,6'-(1,4-butanediyl)bis-, 6,6'-dioxide; 6H-dibenz[c,e][1,2] oxaphosphorin, 6,6'-(p-xylenediyl)bis-, 6,6'-dioxide, and combinations thereof.

7. The bond ply layer of claim 1, wherein the nitrogen-containing compound contains a triazine ring and allyl groups that are reactive with a resin component of the composition.

8. The bond ply layer of claim 1, wherein the composition of the bond ply layer further comprises 5 to 25 weight percent of poly(arylene ether) and 5 to 25 weight percent of an elastomeric polymer, both in solid form.

9. The bond ply layer of claim 1, wherein the composition comprises:
   5 to 20 weight percent of poly(arylene ether) and 5 to 20 weight percent of an elastomer, based on the weight of the composition;
   20 to 30 volume percent of the inorganic filler; and
   25 volume percent to less than 37 volume percent of the liquid resin, which liquid resin comprises:
   20 to 40 volume percent polybutadiene or polyisoprene, based on total resin; and
   5 to 10 volume percent of a nitrogen-containing compound that contains allyl groups.

10. The bond ply layer of claim 1 wherein the liquid resin further comprises 5 to 15 volume percent of a diene reactive monomer.

11. A circuit subassembly, comprising
    at least two circuit laminates, each comprising:
    a dielectric substrate layer formed from a thermosetting composition;
    a conductive metal layer bonded to each side of the dielectric substrate layer, wherein at least one of the conductive metal layers of each circuit laminate has been patterned to form a circuit;
    a bond ply layer disposed between the circuits of on each of the two circuit laminates wherein each of the two sides of the bond ply is in direct contact with a circuit of one of the two circuit laminates, which bond ply layer is the product of a process of lamination in which the bond ply flows and fills areas of the dielectric substrate layer that are not covered by circuit formed by patterned conductive metal layer, wherein the bond ply layer is formed from a composition that, absent solvent, comprises:

25 to 45 volume percent of liquid resin comprising polybutadiene and/or polyisoprene and, in addition, a nitrogen-containing compound having allyl groups, wherein the nitrogen-containing compound is present in an amount of 5 to 15 volume percent, based on total composition, and the polybutadiene and/or polyisoprene is present in an amount of 20 to less than 60 volume percent, based on the total resin;

10 to 40 weight percent of a bromine-containing or phosphorus-containing aromatic compound having a peak melting point of at least about 260° C.; and 5 to 35 volume percent inorganic filler;

wherein the circuit subassembly has a UL-94 rating of at least V-0, a $D_f$ of less than 0.006 at 10 GHz and a $D_k$ of less than 2 to 10 at 10 GHz.

12. The circuit subassembly of claim 11, wherein the composition further comprises 5 to 20 weight percent of poly(arylene ether) and an elastomer, based on the weight of the thermosetting composition;

10 to 40 weight percent, based on the weight of the thermosetting composition, of a bromine-containing or phosphorus-containing aromatic compound having a peak melting point of 260° C. to 500° C.;

20 to 30 volume percent of inorganic filler.

13. The circuit subassembly of claim 12, wherein the liquid resin further comprises a reactive monomer.

14. The circuit subassembly of claim 11, wherein the nitrogen-containing compound contains a triazine ring and has allyl groups that are reactive with polybutadiene and/or polyisoprene resin in the bond ply layer.

15. The circuit subassembly of claim 11, wherein the inorganic filler is selected from group consisting of silica, titanium dioxide, and combinations thereof.

16. The circuit subassembly of claim 11, wherein the bromine-containing aromatic compound has compound has a wt. % bromine, theoretically, of 50 to 80%, a molecular weight of 500 to 2000, and comprises two, three or to four brominated aromatic rings.

17. The circuit subassembly of claim 11, wherein the thermosetting resin is selected from the group consisting of 1,2-polybutadiene, polyisoprene, polybutadiene-polyisoprene copolymers, poly(phenylene ether) resins, curable cyclic olefins or their copolymers, and combinations thereof, and wherein the phosphorus-containing aromatic compound is an oxaphosphorinoxide-containing compound represented by the following structure:

wherein each $R^1$ and $R^2$ independently represents hydrogen or a $C_1$-$C_6$ hydrocarbyl group, each m can independently represent an integer from 1 to 4, n is on average 2 to 4, and Q is a $C_2$-$C_{24}$ divalent or trivalent hydrocarbyl group.

18. The circuit subassembly of claim 11, wherein the dielectric substrate has a thickness of 50 to 1000 micrometers, the bond ply layer has a thickness of 50 to 400 micrometers, and an optional adhesive layer, between the dielectric substrate and each conductive metal layer, has a thickness that is less than 10 percent of the thickness of the dielectric substrate layer.

19. A circuit subassembly, comprising:

(a) at least two circuit laminates, each comprising:

a dielectric substrate layer formed from a thermosetting composition, wherein the thermosetting composition comprises, based on the total weight of the thermosetting composition:

10 to 35 wt. % of a polybutadiene and/or polyisoprene resin;

30 to 70 weight percent of inorganic filler; and 10 to 35 wt. % of a bromine-containing or phosphorus-containing aromatic compound having a peak melting point of at least about 260° C. to about 500° C.;

(ii) a conductive metal layer bonded to each side of the dielectric substrate layer, wherein at least one of the conductive metal layers of each circuit laminate has been patterned to form a circuit; and (b) a bond ply layer disposed between the at least two circuit laminates wherein the bond ply is in direct contact with at least one circuit or conductive layer in at least one of at least two circuit laminates, wherein the composition of the bond ply layer is formed from a composition that comprises:

polybutadiene and/or polyisoprene in an amount of 20 to less than 60 volume percent, based on the total resin, of which all or part is in the form of liquid resin;

25 to 45 volume percent of liquid resin comprising polybutadiene and/or polyisoprene and, in addition, a nitrogen-containing compound having allyl groups, wherein the nitrogen-containing compound is present in an amount of 5 to 15 volume percent, based on total composition;

10 to 40 weight percent of a bromine-containing or phosphorus-containing aromatic compound having a peak melting point of at least about 260° C.; and 5 to 35 volume percent inorganic filler, wherein all percents are calculated based on the bond ply composition absent solvent;

wherein the circuit subassembly has a UL-94 rating of at least V-1, a $D_f$ of less than 0.006 at 10 GHz and a $D_k$ of less than 3.8 at 10 GHz.

20. The circuit assembly of claim 18, wherein volume percent of filler and the volume percent polybutadiene and/or polyisoprene present in the thermosetting composition of the dielectric substrate layers is at least 5 volume percent greater than in the composition of the bond ply.

* * * * *